(12) United States Patent
Tong et al.

(10) Patent No.: US 11,652,450 B2
(45) Date of Patent: May 16, 2023

(54) DYNAMIC FAST CHARGE PULSE GENERATOR FOR AN RF CIRCUIT

(71) Applicant: pSemi Corporation, San Diego, CA (US)

(72) Inventors: Yucheng Tong, San Diego, CA (US); Ping Wing Lai, San Diego, CA (US); Khushali Shah, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 322 days.

(21) Appl. No.: 17/061,290

(22) Filed: Oct. 1, 2020

(65) Prior Publication Data
US 2022/0109410 A1   Apr. 7, 2022

(51) Int. Cl.
*H03F 3/19* (2006.01)
*H03F 1/30* (2006.01)

(52) U.S. Cl.
CPC .............. *H03F 3/19* (2013.01); *H03F 1/30* (2013.01); *H03F 2200/294* (2013.01); *H03F 2200/451* (2013.01)

(58) Field of Classification Search
CPC ........ H03F 3/19; H03F 1/30; H03F 2200/294; H03F 2200/451
USPC ....................................................... 330/296
See application file for complete search history.

(56) References Cited

U.S. PATENT DOCUMENTS

2010/0226450 A1 *   9/2010   Tanaka ................... H04L 25/06
                                                         375/317

OTHER PUBLICATIONS

TUTORIALS 864 of Analog Devices, EPOT Applications: Gain Adjustment in OP-Amp Circuits, https://www.maximintegrated.com/en/design/technical-documents/tutorials/8/864.html, APP 864: Nov. 28, 2001 (Year: 2001).*

* cited by examiner

*Primary Examiner* — Hafizur Rahman
(74) *Attorney, Agent, or Firm* — Jaquez Land Greenhaus & McFarland LLP; John Land, Esq.

(57) ABSTRACT

Circuits and methods for generating a bypass pulse to an RF circuit that increases the response time of the circuit to mode changes. Embodiments include a pulse generation circuit that it is self-initiated and self-terminated, generating a bypass pulse as a function of voltages V1 and V2 along a signal path. Voltage V3, a scaled version of V1, is compared to a voltage V4 derived from V2 and a pulse is output while V3>V4. The pulse temporarily lowers the signal path impedance, reducing the RC time constant of the signal path and allowing fast charging of components coupled to the signal path. The pulse may be used with any other circuit that needs a faster settling time after a mode change but is slowed down by an RC time constant. Usage also extends to providing for rapid discharge of the signal path by adding additional logic components.

20 Claims, 11 Drawing Sheets

*1100*

```
┌─────────────────────────────────────────┐
│ In an RF circuit including a signal path having a first  │
│ voltage node with a fast settling time and a second      │
│ voltage node with a slower settling time, comparing      │
│ a scaled voltage version of a first voltage from the     │──── 1102
│ first voltage node of the signal path to a second        │
│ voltage derived from the second voltage node of the      │
│ signal path                                              │
└─────────────────────────────────────────┘
                        ↓
┌─────────────────────────────────────────┐
│ Outputting a pulse to at least a shunt switch coupled    │
│ to the signal path while the scaled voltage is less      │──── 1104
│ than the second voltage                                  │
└─────────────────────────────────────────┘
```

FIG. 11

DYNAMIC FAST CHARGE PULSE GENERATOR FOR AN RF CIRCUIT

BACKGROUND

(1) Technical Field

This invention relates to electronic circuitry, and more particularly to radio frequency circuits.

(2) Background

Many modern electronic systems include radio frequency (RF) receivers; examples include personal computers, tablet computers, wireless network components, televisions, cable system "set top" boxes, radar systems, and cellular telephones. Many RF receivers are paired with RF transmitters in transceivers, which often are quite complex two-way radios. In some cases, RF transceivers are capable of transmitting and receiving across multiple frequencies in multiple bands. For example, a modern "smart telephone" may include RF transceiver circuitry capable of concurrently operating on different cellular communications systems (e.g., GSM, CDMA, and LTE), on different wireless network frequencies and protocols (e.g., IEEE 802.11abgn at 2.4 GHz at 2.4 GHz and 5 GHz), and on "personal" area networks (e.g., Bluetooth based systems).

The receiver-side of an RF transceiver includes a "front end" that generally includes at least one low noise amplifier ("LNA"). An LNA is responsible for providing the first stage of amplification for a received RF signal. In many applications, multiple LNAs are needed to cover all frequencies in one or more bands. For example, FIG. 1 is block diagram 100 of a simplified RF receiver having multiple LNAs. An RF signal source 102, such as one or more antennas, provides an RF signal to n LNAs (LNA1-LNAn), each of which provides an amplified RF signal to "down-stream" circuits such as down-conversion and baseband circuitry 104_1, 104_n. Additional components not shown in FIG. 1 may include, for example (1) RF switches, filters, and impedance matching circuitry before LNA1-LNAn, (2) attenuators, filters, and impedance matching circuitry after LNA1-LNAn, and (3) control circuitry.

FIG. 2 is a schematic diagram of a prior art LNA 200 that may be used in the circuit of FIG. 1. In the illustrated example, a cascode reference circuit 202 includes a pair of series-connected transistors M1 and M2 is connected between a current source 203 supplied by a voltage input $V_{DD1}$ and an optional degeneration inductor L1, which in turn is connected to circuit ground. The cascode reference circuit 202 provides accurate current levels to a low noise amplifier (LNA) circuit 204. The LNA circuit 204 includes series-connected transistors M3 and M4 connected between a voltage input $V_{DD2}$ (which may be the same a $V_{DD1}$) through load matching circuit 206 and an optional degeneration inductor L2, which in turn is connected to circuit ground. The load matching circuit 206 may include a number of passive elements in known fashion, including inductors, capacitors, and/or resistors, some of which may be variable or bypassable, and provides a means by which the output impedance of the LNA 200 can be matched to a load. In some embodiments, the degeneration inductor L1 may be replaced by a resistor to match the resistive loss of the degeneration inductor L2. The output of the LNA 200 is coupled through an output capacitor COUT connected to transistor M4.

Respective bias circuits 207a, 207b are coupled to the gates of the series-connected transistors M1 & M2. The bias circuits 207a, 207b may provide the same or different bias voltages. The bias circuit 207b is also coupled through a first filter 208 (shown as an RC filter) to the gate of transistor M4. The bias circuit 207a is also coupled to the gate of transistor M3 along a signal path from node V1 to node V2 comprising a second filter 210, a resistor R1, and a third filter 212 (which also functions as a DC blocking capacitor), all series-connected as shown. The resistor R1 provides a high impedance between the bias circuit 207a and the LNA stage 204. An RF input signal, $RF_{IN}$, is applied through a DC blocking capacitor (which may be part of the third filter 212) to the gate of transistor M3. Note that in the illustrated example, the third filter 212 includes a resistor Rg; however, in some embodiments, that resistor Rg may be omitted by relying on the resistor R1.

The transistors M1, M2, M3, M4 may be, for example, FETs, and in particular, may be MOSFETs. The transistors M1, M2 of the cascode reference circuit 202 can be regarded as part of a "DC" subcircuit that monitors and set DC currents in themselves and thereby define voltages, and therefore currents, in the RF-side LNA circuit 204, while being isolated from the LNA circuit 204 (in this example, by the first and second filters 208, 210). Note that the cascode reference circuit 202 is optional in some embodiments, in which case the bias circuits 207a, 207b may be coupled to the gates of transistors M3, M4 through the respective signal path from node V1 to node V2 or through the first filter 208.

One desired characteristic in LNAs is a fast response time during a mode change, such as when switching any of gain, bias, and/or band. In the example illustrated in FIG. 2, the voltage V1 (at the similarly-named node V1) can rapidly change from a low-to-high voltage when the LNA is powered up (for example, from a "sleep" mode when transitioning from transmitting to receiving) due to the fast settling of the bias circuit 207a. However, the voltage V2 (at the similarly-named node V2) rises relatively slowly, owing to the large RC time constant resulting from R1 (which may be in excess of 30 kilo-ohms), the input DC blocking capacitor (e.g., in the third filter 212), the second filter 201, the gate-to-source capacitance Cgs of transistor M3, and any capacitance coupled to $RF_{IN}$ (e.g., from filters, switches, parasitic capacitance, etc.). Thus, the settling time at V1 is fast based on the response time of the bias circuit 207a, but the settling time at V2 is much slower than at V1 due to the noted large RC time constant.

The conventional solution to overcome the large RC time constant problem is to couple a switch Sw (e.g., a FET) in parallel with resistor R1, and set the ON (conducting) state of the switch Sw by a pulse from a fast-charge one-shot (FCOS) circuit 220. The pulse output of the FCOS circuit 220 is initiated by a trigger signal from a controller 222 such as a MIPI-compliant controller. The trigger signal may be sent by the controller 222, for example, when there is gain/bias/band mode switching. Assertion of the pulse causes switch Sw to close, thereby bypassing resistor R1 and effectively reducing the RC constant of the signal path between the V1 node and the gate of transistor M3. Accordingly, the signal path can rapidly charge (hence the name "fast-charge one-shot").

A problem with conventional LNA circuits of the type shown in FIG. 2 is that the timing of the trigger signal from the controller 222 is critical, and generally needs to be custom determined mined for every product using the LNA 200. Custom determination of such timing requires a significant amount of engineering time to verify every case and every state to make sure that the trigger signal is asserted in a timely manner.

A further problem with conventional LNA circuits of the type shown in FIG. 2 is that the width of the pulse from FCOS circuit 220 is fixed. The pulse width is generally chosen to be sufficiently wide (for example, 20-30% over an expected design value) to accommodate process/voltage/temperature (PVT) variations between parts. Such a large "safety margin" often leaves only a very small time from the falling edge of the pulse to meet a timing specification (generally set by a customer), noting that it still takes time for the final voltage to settle after assertion of a pulse from the FCOS circuit 220 due to the charge injection through the switch Sw.

The problems described above of slow settling of a signal path apply to other RF circuits as well, including RF power amplifiers and RF switches.

Accordingly, there is a need for circuitry that can generate a bypass pulse to an RF circuit that decreases the response time of the LNA to mode changes, and which does not require significant engineering time per product to set the timing and width of the pulse. Embodiments of the present invention provide such circuitry, as well as additional benefits and related methods.

SUMMARY

The present invention encompasses circuits and methods for generating a bypass pulse to an RF circuit, such as an LNA, that decreases the response time of the LNA to mode changes, and which does not require significant engineering time per product to set the timing and width of the pulse.

Embodiments include a pulse generation circuit configured to be coupled to at least a bypass switch Sw coupled in parallel with an impedance within a signal path of an RF circuit. The characteristics of the pulse generation circuit are that it is self-initiated and self-terminated, generating a bypass pulse to the switch Sw as a function of the relative values of voltages V1 and V2 along the signal path. Voltage V1 is applied to a scaling circuit which outputs a representative scaled voltage V3 that is generally less than V1. The V3 output from the scaling circuit is applied to a first input of a comparator. A voltage V4 derived from V2 (e.g., a scaled version of V2) is applied to a second input of the comparator. The output of the comparator is in a first state (e.g., a high voltage) when V3 is greater than V4, and in a second state (e.g., a low voltage) when V3 is less than or equal to V4. The result is that the comparator outputs a signal pulse to the switch Sw that temporarily causes the parallel signal path impedance to be essentially taken out of circuit, thereby reducing the RC time constant of the signal path and allowing fast charging of components coupled to the signal path.

The self-initiated and self-terminated pulse from the pulse generation circuit may be used in conjunction with any other circuit that needs a faster settling time after a mode change but is slowed down by an RC time constant. Usage of the pulse generation circuit also may be extended to provide for rapid discharge of the signal path by adding additional logic components. Thus, the dynamic fast charge pulse generation concepts of this disclosure can be applied to multiple RF circuit elements (e.g., RF power amplifiers and RF switches) that have a relatively high resistance isolation network for applying DC bias to RF circuitry and which require a fast settling time. Use of dynamic fast charge pulse generation is not dependent upon having multiple devices in a stack, although the concept can be applied to any one, combination, or all resistive bias feeds into an arbitrary RF circuit region.

The details of one or more embodiments of the invention are set forth in the accompanying drawings and the description below. Other features, objects, and advantages of the invention will be apparent from the description and drawings, and from the claims.

DESCRIPTION OF THE DRAWINGS

FIG. 11 is a process flow chart showing a third method of generating and applying a fast-charge pulse for an RF circuit.

Like reference numbers and designations in the various drawings indicate like elements.

DETAILED DESCRIPTION

The present invention encompasses circuits and methods for generating a bypass pulse to an RF circuit, such as an LNA, that decreases the response time of the LNA to mode changes, and which does not require significant engineering time per product to set the timing and width of the pulse.

Figure 1:
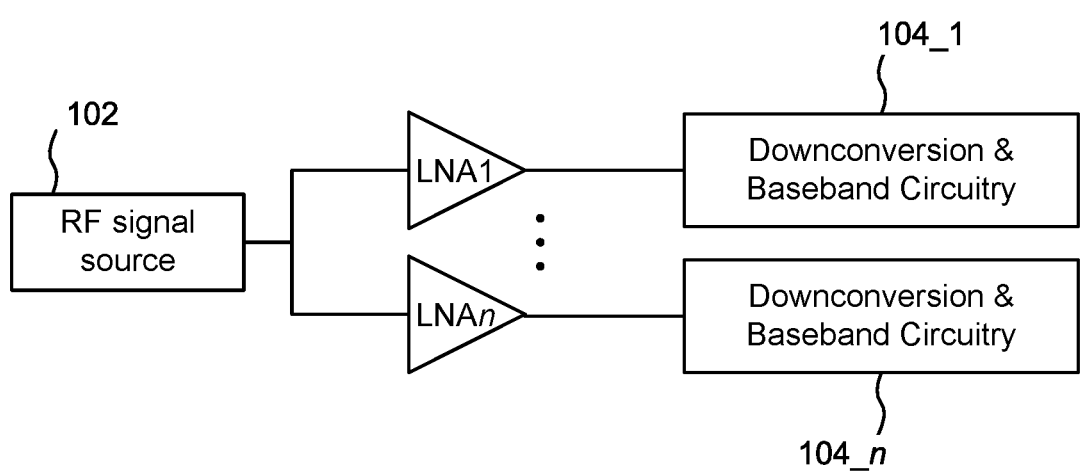
FIG. 1 is block diagram of a simplified RF receiver having multiple LNAs.
Figure 2:
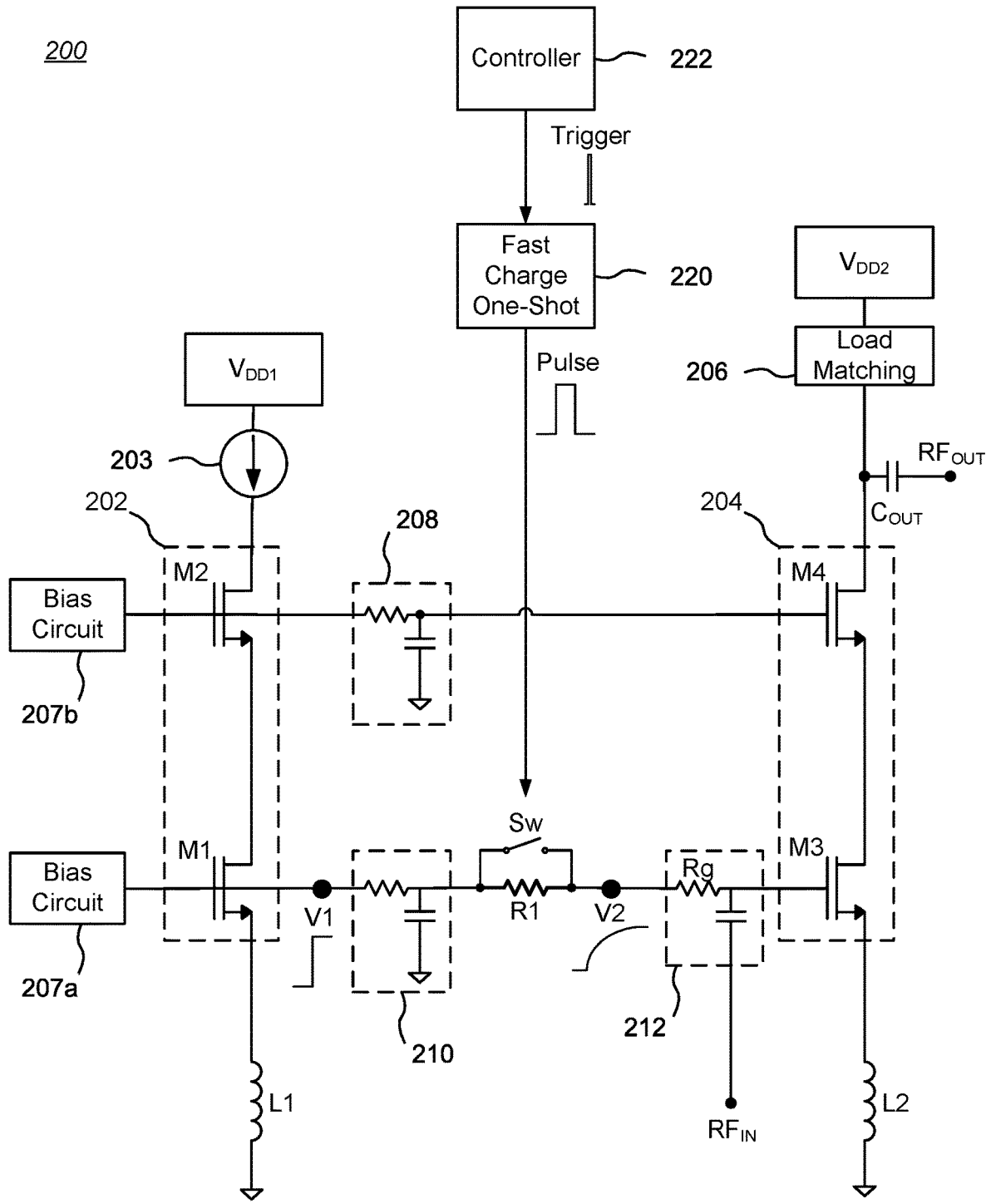
FIG. 2 is a schematic diagram of a prior art LNA that may be used in the circuit of FIG. 1.
Figure 3A:
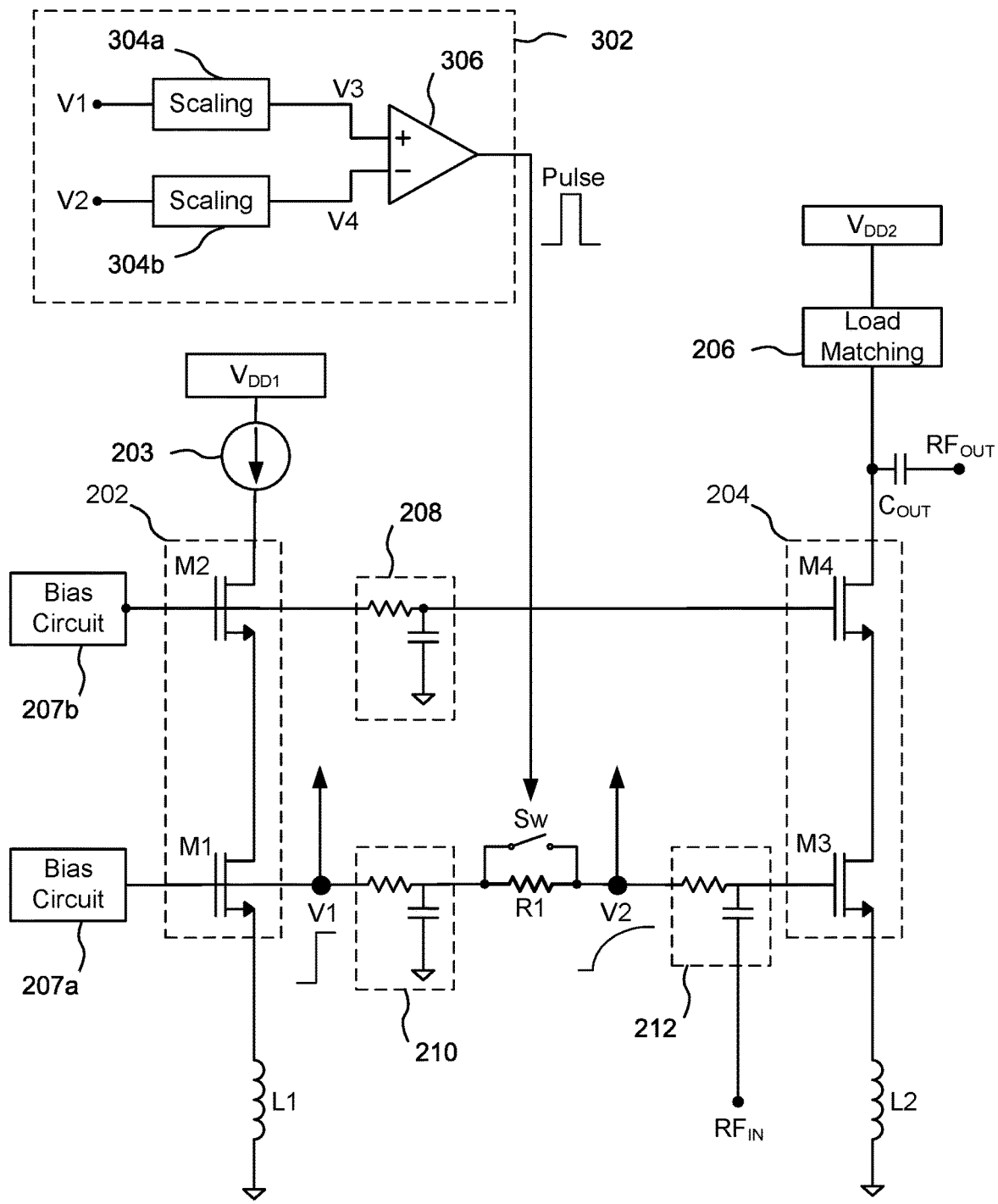
FIG. 3A is a schematic diagram of a first LNA embodiment incorporating a first embodiment of the present invention.

For purposes of this disclosure, a low-noise amplifier will be used as an example of an RF circuit that includes a signal path having a first voltage node with a fast settling time and a second voltage node with a slower settling time. FIG. 3A is a schematic diagram of a first LNA embodiment 300 incorporating a first embodiment of the present invention. The LNA circuitry is essentially the same as shown in FIG. 2. However, the FCOS circuit 220 and the controller 222 of FIG. 2 are replaced by a pulse generation circuit 302. The characteristics of the pulse generation circuit 302 are that it is self-initiated and self-terminated, generating a bypass pulse to the switch Sw as a function of the relative values of the voltages V1 and V2.

Figure 3B:
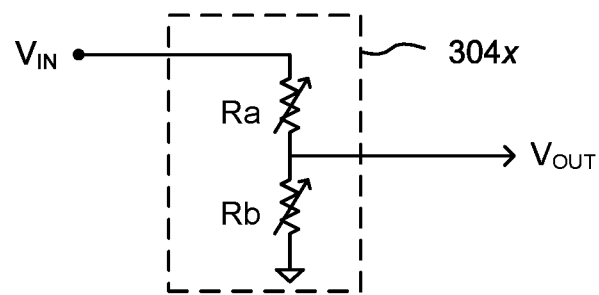
FIG. 3B is a schematic diagram of one embodiment of a scaling circuit that may be used in the circuit of FIG. 3A.

In the illustrated example, V1 and V2 are applied to a respective scaling circuit 304a, 304b which output corresponding scaled values V3 and V4. FIG. 3B is a schematic diagram of one embodiment of a scaling circuit 304x that may be used in the circuit of FIG. 3A. The example scaling circuit 304x is a resistive divider comprising resistors Ra and Rb series-connected between in input voltage $V_{IN}$ (e.g., V1 or V2 in FIG. 3A) and circuit ground. One or both of the resistors Ra and Rb may be adjustable or settable (for example, during manufacture, testing, after assembly in a product, or by dynamic programming) to provide a desired ratio of $V_{IN}$ to $V_{OUT}$, which may differ for the V1 scaling circuit 304a and the V2 scaling circuit 304b. The output of the scaling circuit 304x is a representative voltage $V_{OUT}$ (e.g., V3 or V4 in FIG. 3A) that is generally less than $V_{IN}$. However, in alternative embodiments, the scaling circuit 304x may include an amplifier in order to provide a suitably shifted output that may be necessary, for example, if V2 is level-shifted with respect to V1. In some cases, V2 may not need to be scaled down, in which case the associated scaling circuit 304b may be omitted (that is, V4=V2).

The V3 output from the scaling circuit 304a is applied to a first input of a comparator 306, and the V4 output from the scaling circuit 304b is applied to a second input of the comparator 306. Note that in some embodiments, the comparator 306 may provide for input scaling internally.

The output of the comparator 306 is in a first state (e.g., a high voltage) when V3 is greater than V4, and in a second state (e.g., a low voltage) when V3 is less than or equal to V4.

Figure 4A:
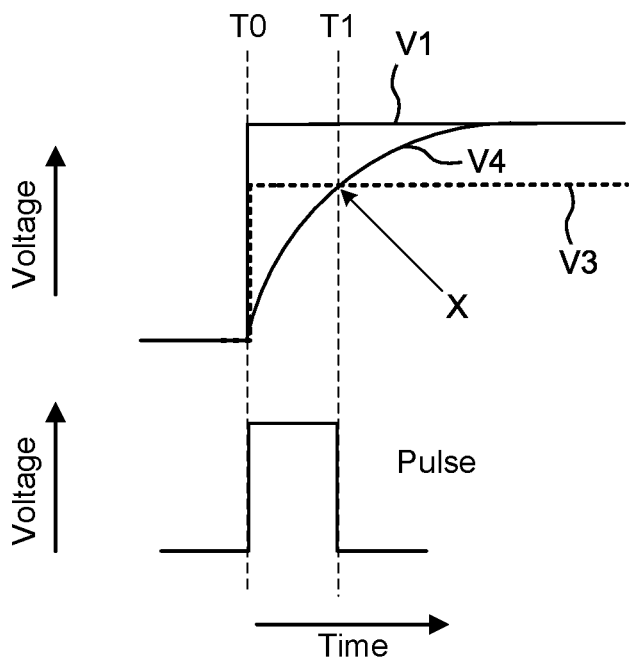
FIG. 4A is a timing diagram showing the relative values of the voltages at V1, V4, and V3 as a function of time for the case in which V4=V2, along with the resulting pulse generated by the comparator of FIG. 3A.

FIG. 4A is a timing diagram 400 showing the relative values of the voltages at V1, V4, and V3 as a function of time for the case in which V4=V2, along with the resulting pulse generated by the comparator 306 of FIG. 3A. At the start of a mode change at time T0, V1 changes abruptly from a low level to a first high level. Concurrently, the scaled voltage V3 also changes abruptly from the low level to a second high level (but less than the first high level of V1, since V3 is a scaled version of V1), and the voltage at the V2 node begins to rise from the low level to the first high level of V1. Accordingly, V4 also beings to rise.

Since V3>V4 between time T0 and time T1, the comparator 306 will output a voltage pulse to the switch Sw, thus bypassing resistor R1. With the switch Sw bypassing resistor R1, the result is a reduction in the time constant of the V1 to V2 signal path. The remaining (but lower) RC time constant of the V1 to V2 signal path still cause V2 (and thus V4) to rise relatively slowly with respect to V1. From time T1 onward, V4≥V3, and the comparator 306 ceases outputting the voltage pulse to the switch Sw at the crossover point X, thereby restoring resistor R1 to the signal path after the V1 node. Note that if V4 is a down-scaled version of V2, then the crossover point X will occur later than T1.

In the case of V4=V2, the value of V3 is generally determined by the pulse width desired for keeping switch Sw closed, and can be adjusted in the scaling circuit 304a (e.g., by adjusting the relative values of resistors Ra and Rb in a resistive divider embodiment of the scaling circuit 304a). For example, to meet a specification requiring that the gain of the LNA 200 be settled within ±0.5 dB, the value of V3 might be set to about 90% of the final value of V4.

As should be appreciated, alternative embodiments can reverse the polarity of the comparisons and switching voltages using known means. Accordingly, more generally, the comparator 306 outputs a pulse of a suitable polarity when the inputs V3 and V4 to the comparator 306 change in a selected relative polarity.

The self-initiated and self-terminated pulse from the pulse generation circuit 302 may be used in conjunction with any other circuit that is capable of utilizing the pulse, such as a circuit that needs a faster settling time after a mode change but is slowed down by a large RC time constant. Following are a number of examples of such alternative uses.

Shunt Discharge

Figure 5:
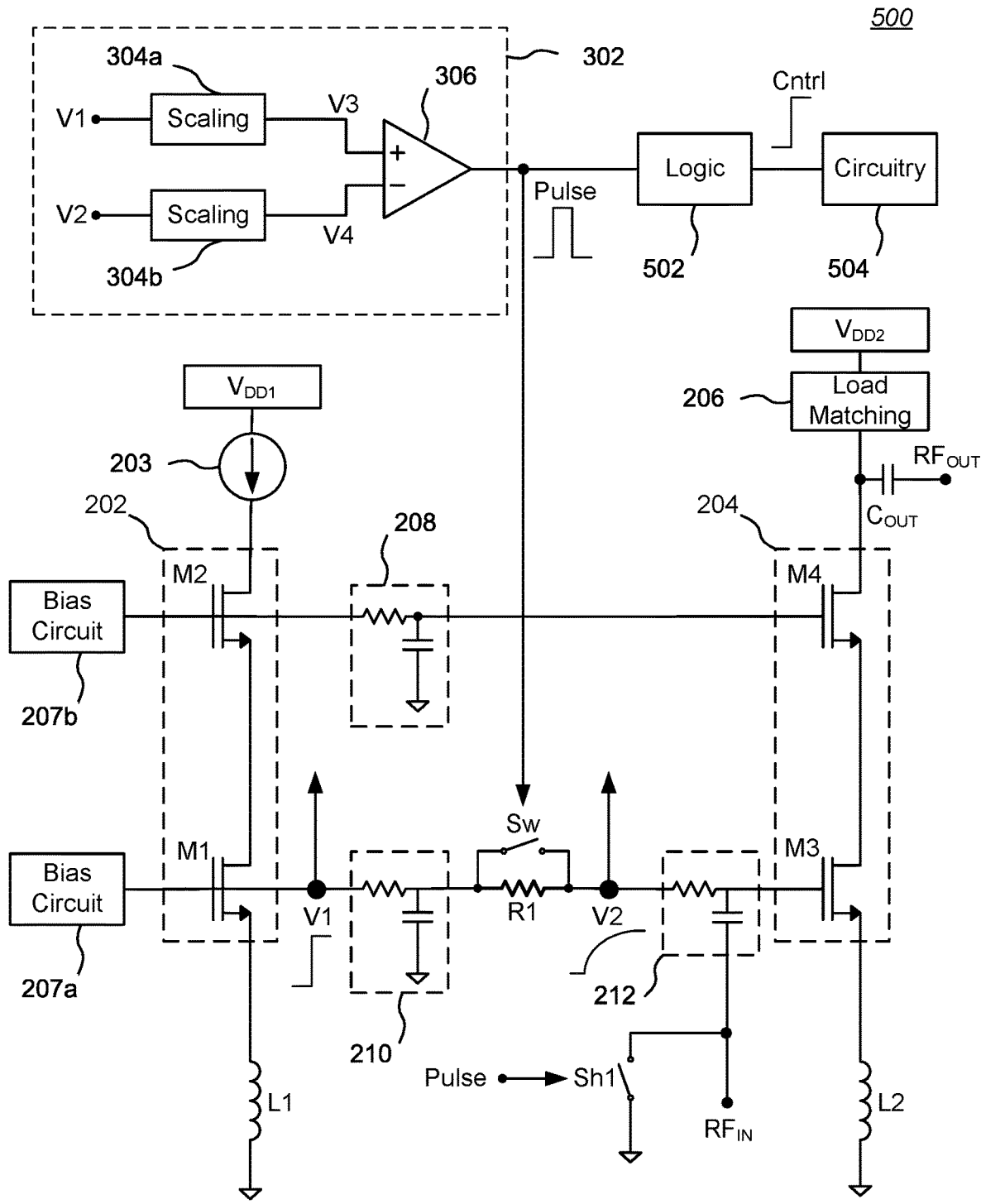
FIG. 5 is a schematic diagram of a second LNA embodiment incorporating a pulse generation circuit providing an additional usage for a generated pulse.

FIG. 5 is a schematic diagram of a second LNA embodiment 500 incorporating a pulse generation circuit 302 providing additional usages for a generated pulse.

In the illustrated example, a shunt switch Sh1 to circuit ground, controlled by the pulse output signal from the pulse generation circuit 302, is coupled between the third filter 212 and $RF_{IN}$. Closing the shunt switch Sh1 during a mode change grounds the third filter 212 and thus allows cumulated charge on the capacitor within the third filter 212 to rapidly discharge, thereby improving the settling time of the LNA 500.

Circuit Enablement/Disablement

As another example, the pulse output signal from the pulse generation circuit 302 of FIG. 5 may be coupled to a logic circuit 502 (e.g., an edge-triggered flip-flop) such that assertion of a pulse from the pulse generation circuit 302 sets a control signal Cntrl coupled to other circuitry 504. The Cntrl signal may enable or disable the circuitry 504 as needed, depending on whether the circuitry 504 requires that the mode change (e.g., gain/bias/band switching) be settled or not settled.

Filter Bypass

As yet another example, the pulse output signal from the pulse generation circuit 302 may be coupled to a bypass switch (not shown) coupled in parallel with the resistor of the first filter 208.

Rapid Signal Path Discharge

In an LNA, a mode change may require that the signal path between the V1 node and the gate of transistor M3 be rapidly discharged (for instance, in order to enter a "sleep" mode when transitioning from receiving to transmitting). However, in a conventional LNA, discharging node V2 (e.g., by a shunt switch coupled to node V1) may be slowed down by the RC time constant of resistor R1 and the capacitor in the second filter 210.

Figure 6:
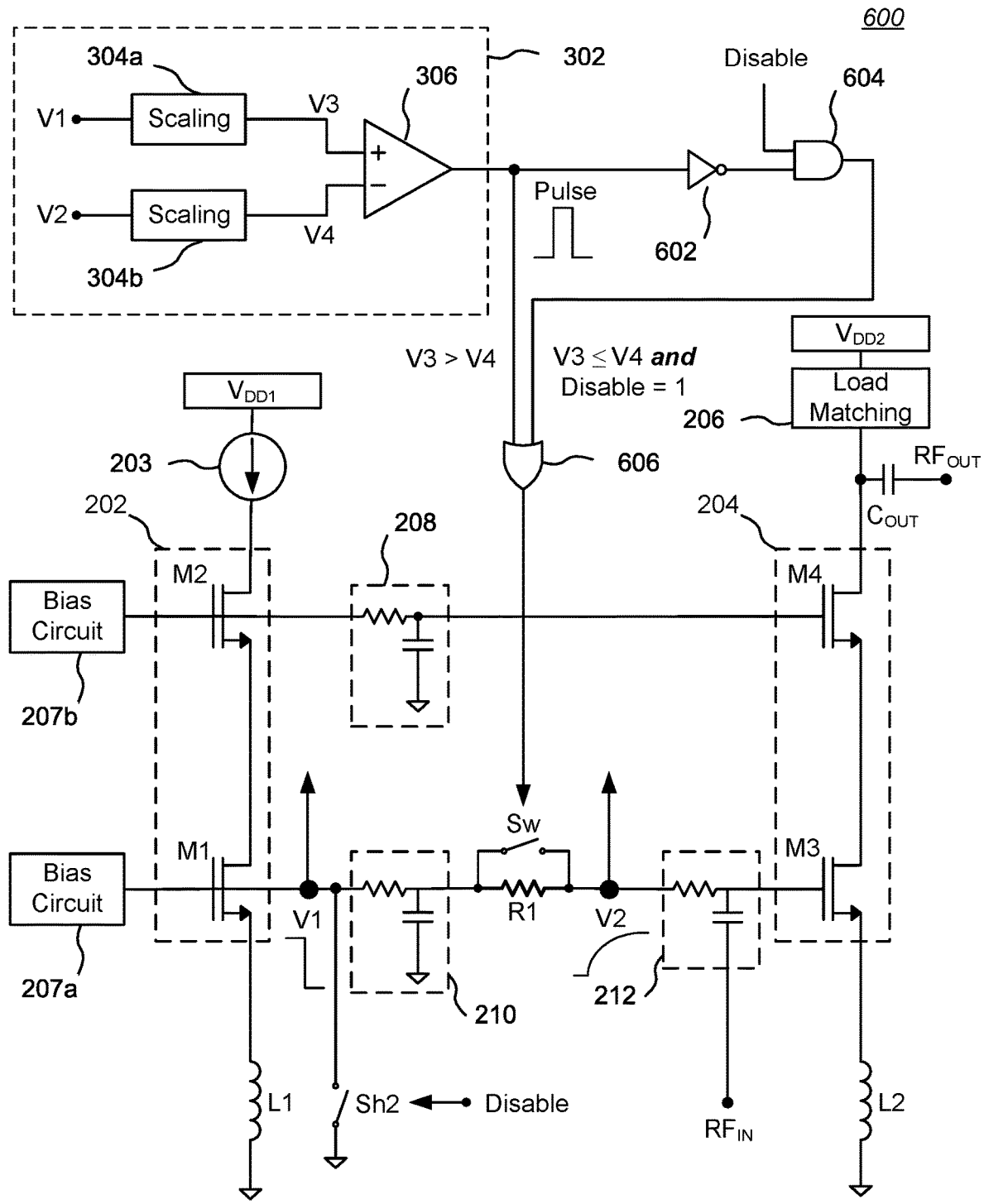
FIG. 6 is a schematic diagram of a third LNA embodiment incorporating a pulse generation circuit that enables a rapid discharge capability.

Usage of the pulse generation circuit 302 may be extended to provide for rapid discharge of the signal path from node V1 to transistor M3. For example, FIG. 6 is a schematic diagram of a third LNA embodiment 600 incorporating a pulse generation circuit 302 that enables a rapid discharge capability. In the illustrated example, a shunt switch Sh2 controlled by a Disable signal (e.g., from mode control circuitry such as the controller 222 in FIG. 2) is coupled between the V1 node and circuit ground to speed up V2 discharge; in other embodiments, the shunt switch Sh2 may be coupled anywhere between the V1 and V2 nodes to speed up V2 discharge. In addition, the pulse output signal from the pulse generation circuit 302 is inverted by an inverter 602, the output of which is coupled to a first input of an AND gate 604. A second input of the AND gate 604 is coupled to (and thus enabled by) the Disable signal. The output of the AND gate 604 is coupled to a first input of an OR gate 606, while the pulse output signal from the pulse generation circuit 302 is coupled to a second input of the OR gate 606.

In operation, when the Disable signal=0, the shunt switch Sh2 is open, the output of the AND gate 604=0, and the pulse generation circuit 302 generates a pulse output through OR gate 606 to close switch Sw while V3>V4. Accordingly, operation is as described above with respect to FIG. 3A.

However, when the Disable signal=1, the output of the AND gate 604 is enabled and follows the inverted output of the pulse generation circuit 302, which closes switch Sw while V3≤V4, thereby bypassing resistor R1. Concurrently, the Disable signal closes the shunt switch Sh2, thus rapidly discharging the voltage at node V1. The bypass of resistor R1 provides a lower impedance connection between node V2 and node V1 and thus a lower RC time constant for the signal path, and accordingly, node V2 is more rapidly discharged through the shunt switch Sh2.

Level Shifted Voltage Nodes

There may be applications where the maximum level of V1 is different from the maximum level of V2. For example, referring to FIG. 5, the transistor M3 may be configured as an RF switch requiring a level shifter (not shown) between the bias circuit 207a and node V2 in order to switch between an ON (conducting) and an OFF (blocking) state. Accordingly, there are cases where both V1 and V2 may be scaled to respective V3 and V4 values based upon the specific characteristics of a particular circuit. Examples where both V1 and V2 may be scaled to respective V3 and V4 values are set forth in TABLE 1 below.

TABLE 1

| V1 Range | V2 Range |
|---|---|
| 0 to 1.2 V | −3 to +3 V |
| 0 to 1.2 V | +3 to −3 V |
| 1.2 to 0 V | −3 to +3 V |
| 1.2 to 0 V | +3 to −3 V |

Figure 4B:
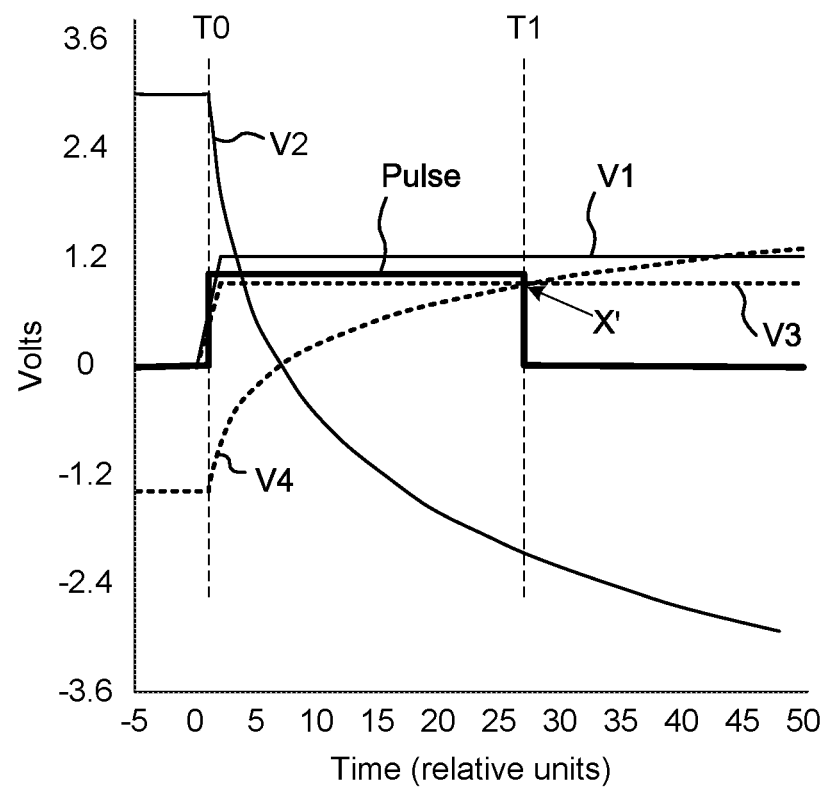
FIG. 4B is a timing diagram showing the relative values of the voltages at V1, V2, V3, and V4 as a function of time for the case in which V2 is level-shifted with respect to V1.

As an example, FIG. 4B is a timing diagram 420 showing the relative values of the voltages at V1, V2, V3, and V4 as a function of time for the case in which V2 is level-shifted with respect to V1, along with the resulting pulse generated by the comparator of FIG. 3A. The time units are relative and depend on the clock frequency of the system. In this example, V1 has a range of about 0 V to about 1.2 V. However, V2 has a level-shifted (and opposite polarity) range of about +3 V to about −3 V. In this example, V3 is scaled to about 75% of V1, resulting in a range of about 0 V to about 0.9 V, and V4 is inverted with respect to V2 and scaled to about −43% of V2, resulting in a range of about −1.3 V to about +1.3 V. These scaling factors mean that V3 and V4 will coincide at about +0.9 V.

At the start of a mode change at time T0, V1 changes abruptly from a low level of about 0 V to a high level of about 1.2 V. Concurrently, the scaled voltage V3 also changes abruptly from the low level to a scaled high level of about 0.9 V. The voltage at the V2 node begins to fall at time T0, and the corresponding inverted and scaled voltage V4 begins to rise from a low level of about −1.3 V to a high level of about +1.3 V. Since V3>V4 between time T0 and time T1, the comparator 306 will output a voltage pulse (for example, to the switch Sw, thus bypassing resistor R1). However, from time T1 onward, V4≥V3, and the comparator 306 ceases outputting the voltage pulse to the switch Sw at the crossover point X'.

Again, more generally, the comparator 306 outputs a pulse of a suitable polarity when the inputs V3 and V4 to the comparator 306 change in a selected relative polarity. Accordingly, by scaling V1 and optionally scaling V2 with the corresponding scaling circuits 304a, 304b, the self-initiated and self-terminated pulse from the pulse generation circuit 302 may be used in conjunction with any circuit that is capable of utilizing the pulse (e.g., bypass switches, shunt switches, and enable or disable inputs) regardless of the original voltage range and/or polarity of V1 and V2.

Benefits

As should be appreciated, the circuit variations shown in FIGS. 3, 5, and 6 may be used in any feasible combination.

Embodiments of the present invention decrease the response time of an RF circuit such as an LNA to mode changes, and do not require significant engineering time per product to set the timing and width of a fast-charge pulse. In addition, since fast-charge pulses are self-initiated and self-terminated, no interaction with an external control circuit (e.g., a MIPI-compliant controller) is necessary.

Further, by allowing setting a desired ratio of V3 to V4 via the scaling circuits 304a, 304b, the width of the pulse generated by the pulse generation circuit 302 is readily adaptable to different embodiments of a coupled LNA. In addition, the pulse generation circuit 302, when co-fabricated within an integrated circuit with an LNA, is affected very little by PVT variations, and accordingly allows for even faster settling times (i.e., the "safety margin" can be made smaller compared to conventional FCOS circuits, since the "safety margin" depends on the scaling circuit 304a and the scaling circuit 304b, if present, which can be set/calibrated in the circuit product).

More generally, the dynamic fast charge pulse generation concepts of this disclosure can be applied to multiple RF circuit elements (e.g., RF power amplifiers and RF switches) that have a relatively high resistance isolation network for applying DC bias to RF circuitry and which require a fast settling time. Use of dynamic fast charge pulse generation is not dependent upon having multiple devices in a stack, although the concept can be applied to any one, combination, or all resistive bias feeds into an arbitrary RF circuit region.

System Aspects

Embodiments of the present invention are useful in a wide variety of larger radio frequency (RF) circuits and systems for performing a range of functions, including (but not limited to) impedance matching circuits, RF power amplifiers, RF low-noise amplifiers (LNAs), phase shifters, attenuators, antenna beam-steering systems, charge pump devices, RF switches, etc. Such functions are useful in a variety of applications, such as radar systems (including phased array and automotive radar systems), radio systems (including cellular radio systems), and test equipment.

Radio system usage includes wireless RF systems (including base stations, relay stations, and hand-held transceivers) that use various technologies and protocols, including various types of orthogonal frequency-division multiplexing ("OFDM"), quadrature amplitude modulation ("QAM"), Code-Division Multiple Access ("CDMA"), Time-Division Multiple Access ("TDMA"), Time-Division Duplex ("TDD"), Frequency-Division Duplex ("FDD"), Wide Band Code Division Multiple Access ("W-CDMA"), Global System for Mobile Communications ("GSM"), Long Term Evolution ("LTE"), 5G, and WiFi (e.g., 802.11a, b, g, n, ac, ax), as well as other radio communication standards and protocols.

Figure 7:
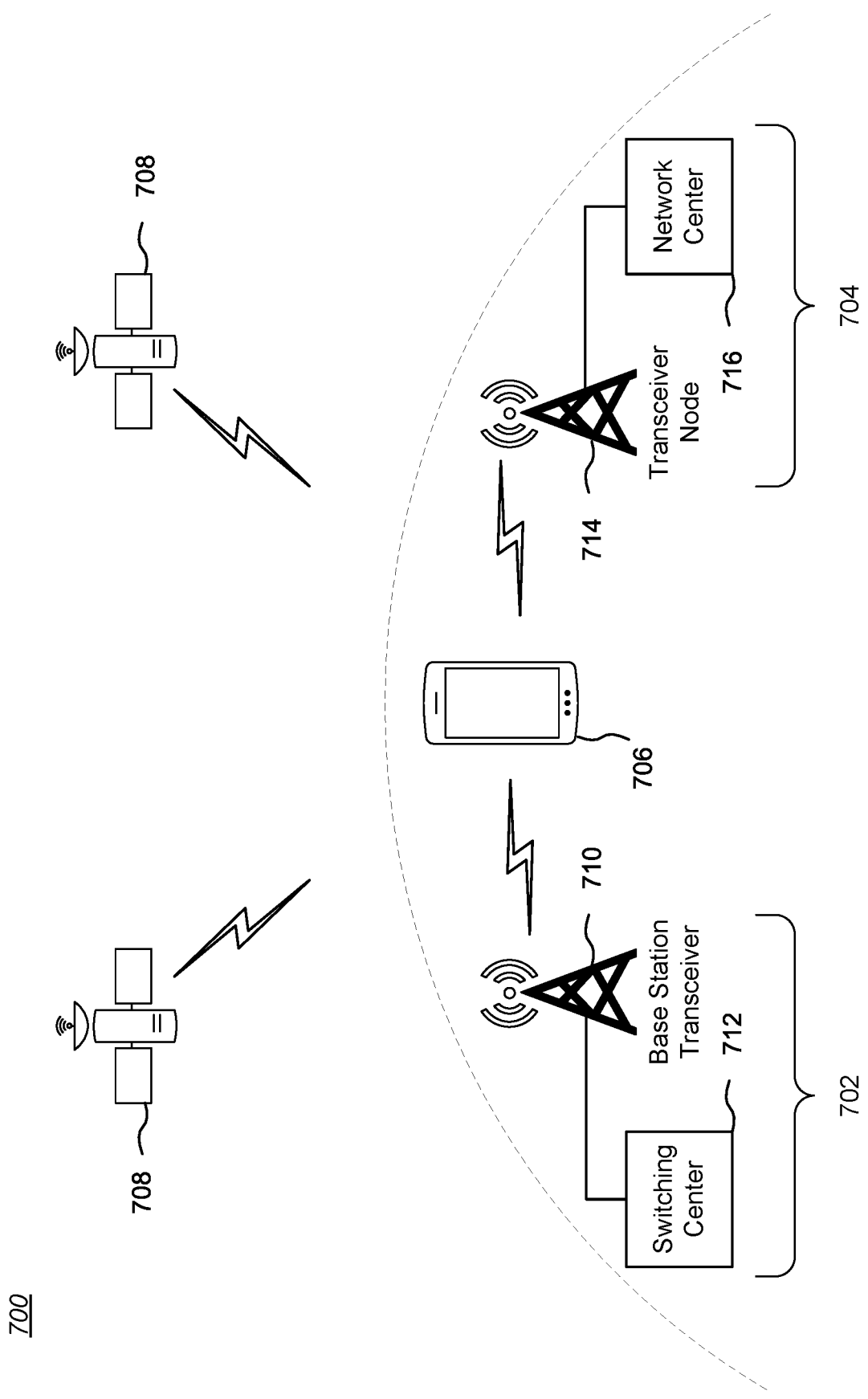
FIG. 7 illustrates an exemplary prior art wireless communication environment comprising different wireless communication systems, and may include one or more mobile wireless devices.

As an example of wireless RF system usage, FIG. 7 illustrates an exemplary prior art wireless communication environment 700 comprising different wireless communication systems 702 and 704, and may include one or more mobile wireless devices 706.

A wireless device 706 may be capable of communicating with multiple wireless communication systems 702, 704 using one or more of the telecommunication protocols noted above. A wireless device 706 also may be capable of communicating with one or more satellites 708, such as navigation satellites (e.g., GPS) and/or telecommunication satellites. The wireless device 706 may be equipped with multiple antennas, externally and/or internally, for operation on different frequencies and/or to provide diversity against deleterious path effects such as fading and multipath interference. A wireless device 706 may be a cellular phone, a personal digital assistant (PDA), a wireless-enabled computer or tablet, or some other wireless communication unit or device. A wireless device 706 may also be referred to as a mobile station, user equipment, an access terminal, or some other terminology.

The wireless system 702 may be, for example, a CDMA-based system that includes one or more base station transceivers (BSTs) 710 and at least one switching center (SC) 712. Each BST 710 provides over-the-air RF communication for wireless devices 706 within its coverage area. The SC 712 couples to one or more BSTs in the wireless system 702 and provides coordination and control for those BSTs.

The wireless system 704 may be, for example, a TDMA-based system that includes one or more transceiver nodes 714 and a network controller (NC) 716. Each transceiver node 714 provides over-the-air RF communication for wireless devices 706 within its coverage area. The NC 716 couples to one or more transceiver nodes 714 in the wireless system 704 and provides coordination and control for those transceiver nodes 714.

In general, each BST 710 and transceiver node 714 is a fixed station that provides communication coverage for wireless devices 706, and may also be referred to as base stations or some other terminology. The SC 712 and the RC 716 are network entities that provide coordination and control for the base stations and may also be referred to by other terminologies.

Figure 8:
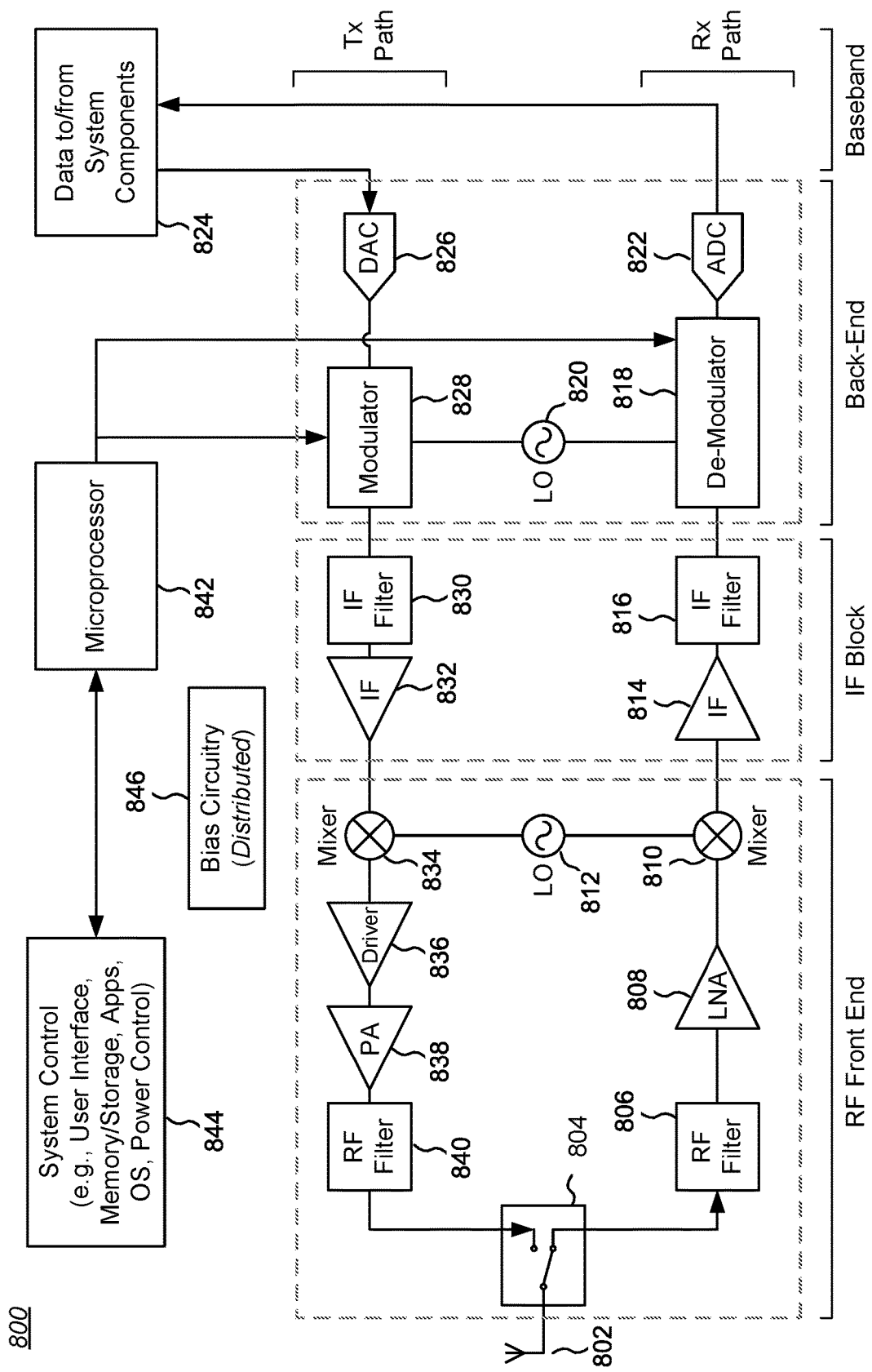
FIG. 8 is a block diagram of a typical prior art transceiver that might be used in a wireless device, such as a cellular telephone.

An important aspect of any wireless system, including the systems shown in FIG. 7, is in the details of how the component elements of the system perform. FIG. 8 is a block diagram of a typical prior art transceiver 800 that might be used in a wireless device, such as a cellular telephone. As illustrated, the transceiver 800 includes a mix of RF analog circuitry for directly conveying and/or transforming signals on an RF signal path, non-RF analog circuitry for operational needs outside of the RF signal path (e.g., for bias voltages and switching signals), and digital circuitry for control and user interface requirements. In this example, a receiver path Rx includes RF Front End, IF Block, Back-End, and Baseband sections (noting that in some implementations, the differentiation between sections may be different).

The receiver path Rx receives over-the-air RF signals through an antenna 802 and a switching unit 804, which may be implemented with active switching devices (e.g., field effect transistors or FETs), or with passive devices that implement frequency-domain multiplexing, such as a diplexer or duplexer. An RF filter 806 passes desired received RF signals to a low noise amplifier (LNA) 808, the output of which is combined in a mixer 810 with the output of a first local oscillator 812 to produce an intermediate frequency (IF) signal. The LNA 808 is preferably of one of the types taught by this disclosure that include a self-initiated and self-terminated pulse generation circuit 302. The IF signal may be amplified by an IF amplifier 814 and subjected to an IF filter 816 before being applied to a demodulator 818, which may be coupled to a second local oscillator 820. The demodulated output of the demodulator 818 is transformed to a digital signal by an analog-to-digital converter 822 and provided to one or more system components 824 (e.g., a video graphics circuit, a sound circuit, memory devices, etc.). The converted digital signal may represent, for example, video or still images, sounds, or symbols, such as text or other characters.

In the illustrated example, a transmitter path Tx includes Baseband, Back-End, IF Block, and RF Front End sections (again, in some implementations, the differentiation between sections may be different). Digital data from one or more system components 824 is transformed to an analog signal by a digital-to-analog converter 826, the output of which is applied to a modulator 828, which also may be coupled to the second local oscillator 820. The modulated output of the modulator 828 may be subjected to an IF filter 830 before being amplified by an IF amplifier 832. The output of the IF amplifier 832 is then combined in a mixer 834 with the output of the first local oscillator 812 to produce an RF signal. The RF signal may be amplified by a driver 836, the output of which is applied to a power amplifier (PA) 838. The amplified RF signal may be coupled to an RF filter 840, the output of which is coupled to the antenna 802 through the switching unit 804.

The operation of the transceiver 800 is controlled by a microprocessor 842 in known fashion, which interacts with system control components (e.g., user interfaces, memory/storage devices, application programs, operating system software, power control, etc.). In addition, the transceiver 800 will generally include other circuitry, such as bias circuitry 846 (which may be distributed throughout the transceiver 800 in proximity to transistor devices), electrostatic discharge (ESD) protection circuits, testing circuits (not shown), factory programming interfaces (not shown), etc.

In modern transceivers, there are often more than one receiver path Rx and transmitter path Tx, for example, to accommodate multiple frequencies and/or signaling modalities. Further, as should be apparent to one of ordinary skill in the art, some components of the transceiver 800 may be in a positioned in a different order (e.g., filters) or omitted. Other components can be (and usually are) added (e.g., additional filters, impedance matching networks, variable phase shifters/attenuators, power dividers, etc.).

As should be appreciated from consideration of the benefits of the present invention, multiple RF circuit elements in FIG. 8, such as the power amplifier (PA) 838, driver 836, switch 804, and LNA 808, can all leverage the dynamic fast charge pulse generator of this disclosure when fast-settling is desired.

As a person of ordinary skill in the art will understand, the system architecture of products incorporating embodiments of the present invention is beneficially impacted by the current invention in critical ways, including faster settling times for RF circuits while avoiding significant engineering time per product to set the timing and width of a fast-charge pulse. These system-level improvements are specifically enabled by the current invention, particularly since a number of RF standards and product specifications require fast and reliable LNA settling times.

Methods

Figure 9:
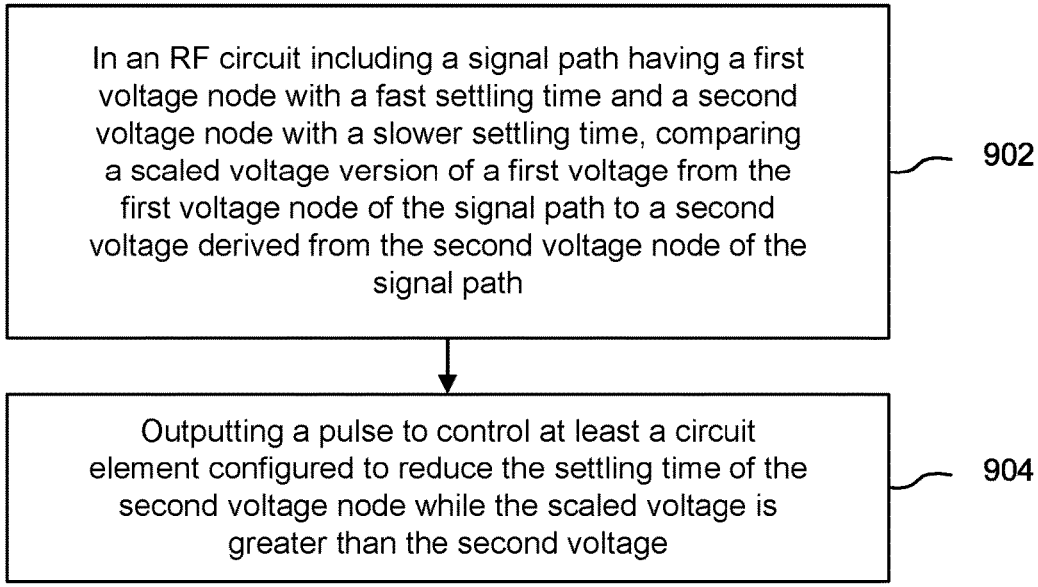
FIG. 9 is a process flow chart showing a first method of generating and applying a fast-charge pulse for an RF circuit.

Another aspect of the invention includes methods for generating a fast-charge pulse for an LNA. As an example, FIG. 9 is a process flow chart 900 showing a first method of generating and applying a fast-charge pulse for an RF circuit. The method includes: in an RF circuit including a signal path having a first voltage node with a fast settling time and a second voltage node with a slower settling time, comparing a scaled voltage version of a first voltage from the first voltage node of the signal path to a second voltage derived from the second voltage node of the signal path (Block 902); and outputting a pulse to control at least a circuit element (e.g., the switch Sw coupled to parallel resistor R1 in FIG. 3A) configured to reduce the settling time of the second voltage node while the scaled voltage is greater than the second voltage (Block 904).

Figure 10:
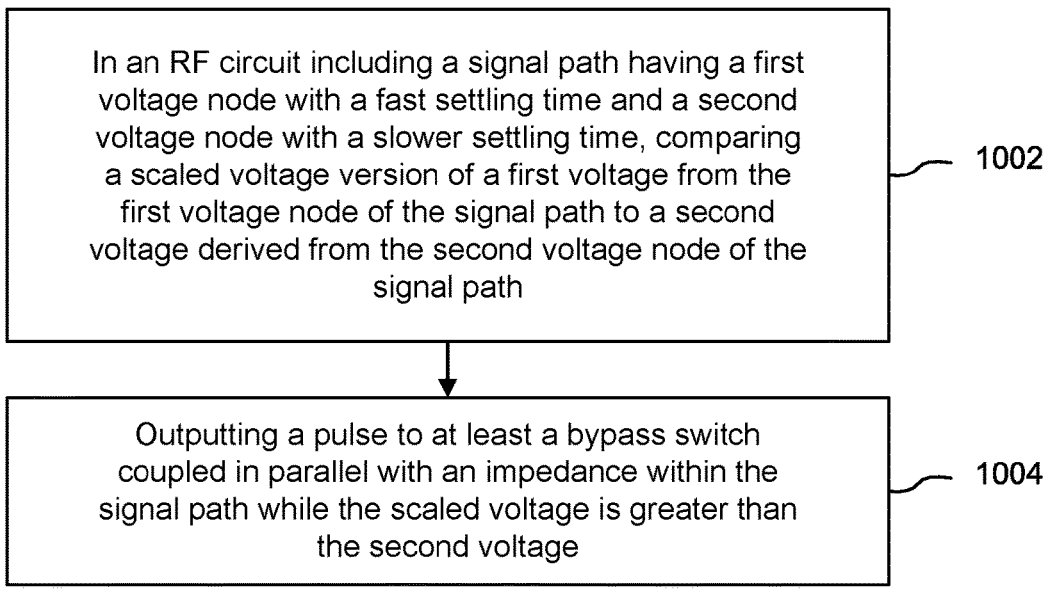
FIG. 10 is a process flow chart showing a second method of generating and applying a fast-charge pulse for an RF circuit.

As another example, FIG. 10 is a process flow chart 1000 showing a second method of generating and applying a fast-charge pulse for an RF circuit. The method includes: in an RF circuit including a signal path having a first voltage node with a fast settling time and a second voltage node with a slower settling time, comparing a scaled voltage version of a first voltage from the first voltage node of the signal path to a second voltage derived from the second voltage node of the signal path (Block 1002); and outputting a pulse to at least a bypass switch coupled in parallel with an impedance within the signal path while the scaled voltage is greater than the second voltage (Block 1004).

As yet another example, FIG. 11 is a process flow chart 1100 showing a third method of generating and applying a fast-charge pulse for an RF circuit. The method includes: in an RF circuit including a signal path having a first voltage node with a fast settling time and a second voltage node with a slower settling time, comparing a scaled voltage version of a first voltage from the first voltage node of the signal path to a second voltage derived from the second voltage node of the signal path (Block 1102); and outputting a pulse to at least a shunt switch coupled to the signal path while the scaled voltage is less than the second voltage (Block 1104).

Additional aspects of the above method may include one or more of the following: wherein the RF circuit is an LNA; wherein the impedance is coupled between the first voltage node and the second voltage node; wherein the second voltage node has an RC constant determined in part by the impedance; wherein the output pulse is configured to be coupled to at least one other circuit capable of utilizing the generated output pulse; wherein the output pulse is configured to be coupled to a shunt switch coupled between an RF signal input of the RF circuit and circuit ground; wherein the scaled voltage version of the first voltage is generated by a resistive divider; wherein the second voltage derived from the second voltage node is a scaled version of the voltage at the second voltage node; and/or further including generating an inverted version of the output pulse while (1) the scaled voltage is less than or equal to the second voltage and (2) a control signal is asserted.

Fabrication Technologies & Options

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form an end product such as a cellular telephone, laptop computer, or electronic tablet, or to form a higher level module which may be used in a wide variety of products, such as vehicles, test equipment, medical devices, etc. Through various configurations of modules and assemblies, such ICs typically enable a mode of communication, often wireless communication.

Conclusion

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A fast-charge pulse generation circuit configured to be coupled to an RF circuit including a signal path having a first voltage node with a fast settling time and a second voltage node with a slower settling time, the fast-charge pulse generation circuit including:
    (a) a scaling circuit configured to receive a first voltage from the first voltage node of the signal path and to output a scaled voltage version of the first voltage; and
    (b) a comparator having a first input coupled to the scaled voltage, a second input configured to receive a second voltage derived from the second voltage node of the signal path, and an output configured to be coupled to a circuit element configured to reduce the settling time of the second voltage node;
    wherein the comparator generates an output pulse which controls the circuit element, when coupled to the comparator output, while the scaled voltage is greater than the second voltage.

2. The invention of claim 1, wherein the second input voltage to the comparator is a scaled version of the voltage at the second voltage node.

3. A fast-charge pulse generation circuit configured to be coupled to an RF circuit including a signal path having a first voltage node with a fast settling time and a second voltage node with a slower settling time, the fast-charge pulse generation circuit including:
    (a) a scaling circuit configured to receive a first voltage from the first voltage node of the signal path and to output a scaled voltage version of the first voltage; and
    (b) a comparator having a first input coupled to the scaled voltage, a second input configured to receive a second voltage derived from the second voltage node of the signal path, and an output configured to be coupled to at least a bypass switch coupled in parallel with an impedance within the signal path;
    wherein the comparator generates an output pulse which closes the bypass switch, when coupled to the comparator output, while the scaled voltage is greater than the second voltage.

4. The invention of claim 3, wherein the RF circuit is a low-noise amplifier.

5. The invention of claim 3, wherein the impedance is coupled between the first voltage node and the second voltage node.

6. The invention of claim 3, wherein the second voltage node has an RC constant determined in part by the impedance.

7. The invention of claim 3, wherein the output of the comparator is configured to be coupled to at least one other circuit capable of utilizing the generated output pulse.

8. The invention of claim 3, wherein the output of the comparator is configured to be coupled to a shunt switch coupled between an RF signal input of the RF circuit and circuit ground.

9. The invention of claim 3, wherein the scaling circuit includes a resistive divider.

10. The invention of claim 3, further including logic circuitry, coupled to the output of the comparator, for generating an inverted version of the output pulse while (1) the scaled voltage is less than or equal to the second voltage and (2) a control signal is asserted.

11. The invention of claim 3, wherein the second input voltage to the comparator is a scaled version of the voltage at the second voltage node.

12. A low-noise amplifier (LNA), the LNA including:
    (a) a signal path having a first voltage node with a fast settling time in response to a mode change for the LNA, and a second voltage node with a slower settling time in response to the mode change for the LNA;
    (b) a fast-charge pulse generation circuit including:
        (1) a scaling circuit configured to receive a first voltage from the first voltage node and output a scaled voltage version of the first voltage; and
        (2) a comparator having a first input coupled to the scaled voltage, a second input configured to receive a second voltage derived from the second voltage node, and an output coupled to at least a bypass switch coupled in parallel with an impedance within the signal path of the LNA;
    wherein the comparator generates an output pulse which closes the bypass switch, when coupled to the comparator output, while the scaled voltage is greater than the second voltage.

13. The invention of claim 12, wherein the impedance is coupled between the first voltage node and the second voltage node.

14. The invention of claim 12, wherein the second voltage node has an RC constant determined in part by the impedance.

15. The invention of claim 12, wherein the output of the comparator is configured to be coupled to at least one other circuit capable of utilizing the generated output pulse.

16. The invention of claim 12, wherein the output of the comparator is configured to be coupled to a shunt switch coupled between an RF signal input of the LNA and circuit ground.

17. The invention of claim 12, wherein the scaling circuit includes a resistive divider.

18. The invention of claim 12, wherein the second voltage derived from the second voltage node is a scaled version of the voltage at the second voltage node.

19. The invention of claim 12, further including logic circuitry, coupled to the output of the comparator, for generating an inverted version of the output pulse while (1) the scaled voltage is less than or equal to the second voltage and (2) a control signal is asserted.

20. The invention of claim 19, further including a shunt switch coupled to the first voltage node and controlled by the control signal.

\* \* \* \* \*